United States Patent
Yu et al.

(10) Patent No.: US 12,213,293 B2
(45) Date of Patent: Jan. 28, 2025

(54) SHIELDING COVER, SHIELDING CAN, PRINTED CIRCUIT BOARD ASSEMBLY, AND ELECTRONIC DEVICE

(71) Applicant: Huawei Technologies Co., Ltd., Shenzhen (CN)

(72) Inventors: Huanhuan Yu, Shenzhen (CN); Dongqing Ding, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 319 days.

(21) Appl. No.: 17/780,896

(22) PCT Filed: Nov. 5, 2020

(86) PCT No.: PCT/CN2020/126768
§ 371 (c)(1),
(2) Date: May 27, 2022

(87) PCT Pub. No.: WO2021/103975
PCT Pub. Date: Jun. 3, 2021

(65) Prior Publication Data
US 2023/0019918 A1    Jan. 19, 2023

(30) Foreign Application Priority Data
Nov. 30, 2019   (CN) .......................... 201911208185.4

(51) Int. Cl.
*H05K 1/02* (2006.01)
*H05K 9/00* (2006.01)

(52) U.S. Cl.
CPC ........... *H05K 9/0032* (2013.01); *H05K 1/028* (2013.01); *H05K 2201/10128* (2013.01)

(58) Field of Classification Search
CPC ................. H05K 9/0032; H05K 1/028; H05K 2201/10128
USPC ........................................................ 361/749
See application file for complete search history.

(56) References Cited

U.S. PATENT DOCUMENTS

| | | | |
|---|---|---|---|
| 2011/0007481 A1* | 1/2011 | Miyazaki | H05K 1/147 361/749 |
| 2013/0120957 A1* | 5/2013 | Werner | H05K 9/0032 174/382 |
| 2014/0043577 A1 | 2/2014 | Kim et al. | |
| 2017/0171961 A1 | 6/2017 | Ball et al. | |
| 2017/0280554 A1* | 9/2017 | Toyoshima | H05K 3/384 |
| 2018/0069312 A1 | 3/2018 | Lee et al. | |
| 2018/0199473 A1 | 7/2018 | Zhang | |

(Continued)

FOREIGN PATENT DOCUMENTS

| CN | 102892280 A | 1/2013 |
|---|---|---|
| CN | 104981347 A | 10/2015 |
| CN | 205622671 U | 10/2016 |

(Continued)

*Primary Examiner* — Binh B Tran
(74) *Attorney, Agent, or Firm* — Conley Rose, P.C.

(57) ABSTRACT

A shielding cover shields and protects a component in an electronic device. The shielding cover includes a cover body and a flexible printed circuit board disposed on the cover body. A first opening is disposed on an end face of the cover body, and the flexible printed circuit board may be affixed to an outer side of the end face of the cover body through soldering, bonding, or the like, blocking the first opening.

20 Claims, 7 Drawing Sheets

(56) References Cited

U.S. PATENT DOCUMENTS

2020/0178415 A1   6/2020  Kim et al.
2020/0389999 A1  12/2020  Lee et al.

FOREIGN PATENT DOCUMENTS

| | | |
|---|---|---|
| CN | 206181715 U | 5/2017 |
| CN | 107785648 A | 3/2018 |
| CN | 108879239 A | 11/2018 |
| EP | 3307036 A1 | 4/2018 |
| EP | 3419398 A1 | 12/2018 |
| EP | 3420786 B1 | 12/2020 |
| WO | 2009114225 A1 | 9/2009 |
| WO | 2014044066 A1 | 3/2014 |
| WO | 2016182643 A1 | 11/2016 |
| WO | 2017188615 A1 | 11/2017 |
| WO | 2018212549 A1 | 11/2018 |
| WO | 2019164367 A1 | 8/2019 |

\* cited by examiner

SHIELDING COVER, SHIELDING CAN, PRINTED CIRCUIT BOARD ASSEMBLY, AND ELECTRONIC DEVICE

CROSS-REFERENCE TO RELATED APPLICATIONS

This is a U.S. National Stage of International Patent Application No. PCT/CN2020/126768 filed on Nov. 5, 2020, which claims priority to Chinese Patent Application No. 201911208185.4 filed on Nov. 30, 2019. Both of the aforementioned applications are hereby incorporated by reference in their entireties.

TECHNICAL FIELD

This application relates to the field of shielding device technologies, and in particular, to a shielding cover, a shielding can, a printed circuit board assembly, and an electronic device.

BACKGROUND

In an electronic device, a shielding can is usually disposed on a component to block an interference path between an interfering component and an interfered component, to protect and shield the component.

Currently, a commonly used shielding can generally includes a shielding frame and a shielding cover disposed on the shielding frame. A PCBA (printed circuit board assembly, printed circuit board assembly) is used as an example. The PCBA includes a PCB (printed circuit board, printed circuit board) and a component disposed on the PCB. The shielding can is disposed on the component on the PCB, and is soldered to the PCB. It may be understood that the shielding can generally needs to be set to avoid all components on the PCB, so as to avoid affecting performance of the component on the PCB. In this way, a component that protrudes from a surface of the PCB by a largest height determines a spacing between the shielding can and the PCB, and therefore determines an overall thickness of the PCBA. This is not conducive to implementing a thinning design of the entire electronic device.

SUMMARY

Technical solutions of this application provide a shielding cover, a shielding can, a printed circuit board assembly, and an electronic device, to comply with a development trend of a light and thin design of the electronic device.

According to a first aspect, the technical solutions of this application provide a shielding cover. The shielding cover may be used in an electronic device, to shield and protect a component in the electronic device. The shielding cover includes a cover body and an FPC disposed on the cover body. A first opening is disposed on an end face of the cover body, and the FPC may be fastened to an outer side of the end face of the cover body through soldering, bonding, or the like, and blocks the first opening.

In a possible embodiment of this application, when the FPC is specifically disposed, the FPC includes a substrate layer and a metal-plated layer disposed on the substrate layer. A material of the substrate layer may be plastic, resin, or the like, and a thickness of the substrate layer may range from 5 μm to 50 μm. The metal-plated layer plays a main shielding role, and may be selected as a copper-plated layer. A thickness of the metal-plated layer may range from 6 μm to 36 μm.

In addition, a cover film may be further disposed on the metal-plated layer. The cover film may be disposed around the opening, and a thickness of the cover film may range from 15 μm to 45 μm. In addition, the cover film has a plurality of grooves for exposing the metal-plated layer. In this way, a solder material for soldering the FPC may be accommodated in the grooves. This facilitates solder printing of the FPC and helps improve soldering quality of the FPC.

In a possible embodiment of this application, a minimum wavelength of a signal transmitted by the component in the electronic device may be set to k. To enable the shielding cover to meet a shielding requirement, a spacing between two adjacent grooves may be not greater than $\frac{1}{20}\lambda$.

According to a second aspect, the technical solutions of this application further provide a shielding can. The shielding can may be disposed on a to-be-shielded component. The shielding can includes a shielding frame and the shielding cover according to the first aspect. The shielding frame has a first end part and a second end part that are disposed opposite to each other. The first end part has a second opening, and the second end part has a third opening. The to-be-shielded component may enter a shielding cavity of the shielding can through the second opening of the first end part.

When the shielding cover is disposed on the shielding frame, the shielding cover may be disposed on the second end part of the shielding frame. In this case, the first opening and the third opening are disposed opposite to each other, the to-be-shielded component may sequentially pass through the third opening and the first opening, and there is a specified distance between the component and the FPC, to avoid affecting performance of the component. In addition, when the shielding can is disposed on the to-be-shielded component, because the component may pass through the third opening and the first opening, an avoidance design of the shielding frame for a part of the component passing through the third opening and the first opening can be avoided. This helps reduce a distance between the first end part and the second end part of the shielding frame.

In a possible embodiment of this application, a plurality of protrusions may be disposed on inner sidewalls of the shielding cover, and a plurality of grooves are disposed on the shielding frame. In this way, the shielding cover and the shielding frame may be detachably connected in a one-to-one correspondence between the protrusions and the grooves, to facilitate maintenance of the component disposed in the shielding cavity of the shielding cover.

In a possible embodiment of this application, a supporting portion is further disposed on the first end part of the shielding frame, and the supporting portion may extend to the inside of the shielding frame. In addition, the supporting portion may be further fit to an end face of a cover body of the shielding cover. This helps implement effective support of the supporting portion for the shielding cover, to improve stability of an overall structure of the shielding can.

According to a third aspect, an embodiment of this application further provides a printed circuit board assembly. The printed circuit board assembly includes a PCB, a component disposed on the PCB, and the shielding can disposed on the component according to the second aspect. The component may pass through a third opening of a frame body of the shielding can and a first opening of a shielding cover. In this way, an avoidance design of a shielding frame for a part of a component passing through the third opening and the first opening can be avoided, to help reduce a distance between a first end part and a second end part of the shielding frame. In addition, a thickness of a current FPC is relatively small. In this way, a height of the shielding can protruding from a surface of the PCB is relatively small. This helps implement a relatively thin design of an overall thickness of the printed circuit board assembly.

According to a fourth aspect, an embodiment of this application further provides an electronic device. The electronic device includes a display screen, a middle frame, a rear housing, and a printed circuit board assembly. The middle frame is configured to bear the printed circuit board assembly and the display screen. The display screen and the printed circuit board assembly are located on both sides of the middle frame. The rear housing is located on a side that is of the printed circuit board assembly and that is away from the middle frame. On a basis of implementing a design of the printed circuit board assembly in this embodiment of this application, a thinning design of the entire electronic device can be implemented. In addition, in some scenarios, a requirement for structural stability of the middle frame used as a bearing structure is relatively high. In this case, a thickness of the middle frame cannot be designed to be excessively small. Therefore, thinning of the printed circuit board assembly can avoid an increase in a thickness of the entire electronic device while meeting the structural stability of the middle frame.

In a possible embodiment of this application, when the printed circuit board assembly is specifically disposed, the printed circuit board assembly includes a PCB, a component disposed on the PCB, and a shielding can disposed on the component. The shielding can includes a shielding frame and a shielding cover. The shielding cover is disposed on the shielding frame, and includes a cover body and a flexible printed circuit board disposed on the cover body. A first opening is disposed on an end face of the cover body. The flexible printed circuit board is fastened to a side that is of the end face of the cover body and that is away from the shielding frame, and blocks the first opening. The shielding frame is fastened to the printed circuit board. An end that is of the shielding frame and that is away from the printed circuit board has a second opening. The second opening is disposed opposite to the first opening. The component may sequentially pass through the second opening and the first opening, and there is a specified distance between the component and the flexible printed circuit board. In this way, an avoidance design of the shielding frame for a part of the component passing through the second opening and the first opening can be avoided, to help reduce a height of the shielding frame. In addition, a thickness of the current FPC is relatively small. In this way, a height of the shielding can protruding from a surface of the PCB is relatively small. This helps implement a relatively thin design of an overall thickness of the printed circuit board assembly.

In a possible embodiment of this application, when the FPC is specifically disposed, the FPC includes a substrate layer and a metal-plated layer disposed on the substrate layer. A material of the substrate layer may be plastic, resin, or the like, and a thickness of the substrate layer may range from 5 μm to 50 μm. The metal-plated layer plays a main shielding role, and may be selected as a copper-plated layer. A thickness of the metal-plated layer may range from 6 μm to 36 μm.

In addition, a cover film may be further disposed on the metal-plated layer. The cover film may be disposed around the opening, and a thickness of the cover film may range from 15 μm to 45 μm. In addition, the cover film has a plurality of grooves for exposing the metal-plated layer. In this way, a solder material for soldering the FPC may be accommodated in the grooves. This facilitates solder printing of the FPC and helps improve soldering quality of the FPC.

In a possible embodiment of this application, a minimum wavelength of a signal transmitted by a component in the electronic device may be set to L. To enable the shielding cover to meet a shielding requirement, a spacing between two adjacent grooves may be not greater than $\frac{1}{20}\lambda$.

In a possible embodiment of this application, a plurality of protrusions may be disposed on inner sidewalls of the shielding cover, and a plurality of grooves are disposed on the shielding frame. In this way, the shielding cover and the shielding frame may be detachably connected in a one-to-one correspondence between the protrusions and the grooves, to facilitate maintenance of the component disposed in a shielding cavity of the shielding cover.

In a possible embodiment of this application, a supporting portion is further disposed on a first end part of the shielding frame, and the supporting portion may extend to the inside of the shielding frame. In addition, the supporting portion may be further fit to the end face of the cover body of the shielding cover. This helps implement effective support of the supporting portion for the shielding cover, to improve stability of an overall structure of the shielding can.

In a possible embodiment of this application, the shielding can may be disposed on a side that is of the printed circuit board assembly and that faces the middle frame. In this case, an accommodation slot may be disposed on the middle frame, and the shielding can is partially or entirely accommodated in the accommodation slot. In this way, the printed circuit board assembly is fastened.

In addition, a bracket may be further disposed between the printed circuit board assembly and the rear housing. When the shielding can is disposed on a side that is of the printed circuit board assembly and that faces the rear housing, the shielding can may be fastened to the bracket.

According to a fifth aspect, an embodiment of this application further provides a shielding can. The shielding can has a can body and an FPC disposed on the can body. The can body has a shielding cavity capable of accommodating a component. An opening is disposed on an end face of an end of the can body. A to-be-shielded component may enter the shielding cavity through an end that is of the can body and that is opposite to the opening. In addition, the component may further pass through the opening, and there is a specified distance between the component and the FPC. Therefore, an avoidance design of the shielding can for a part of the component passing through the opening can be avoided, to help reduce a height of the shielding can along a passing direction of the component.

When the FPC is specifically disposed, the FPC may be soldered, by using a solder material such as solder paste, on a side that is of the opening and that is away from the shielding cavity, to block the opening, to implement sealing and shielding of the shielding can. The shielding can in this embodiment of this application includes only the cover body and the FPC disposed at the opening. Therefore, a structure of the shielding can is simple.

In a possible embodiment of this application, when the FPC is specifically disposed, the FPC includes a substrate layer and a metal-plated layer disposed on the substrate layer. A material of the substrate layer may be plastic, resin, or the like, and a thickness of the substrate layer may range from 5 μm to 50 μm. The metal-plated layer plays a main shielding role, and may be selected as a copper-plated layer. A thickness of the metal-plated layer may range from 6 μm to 36 μm.

In addition, a cover film may be further disposed on the metal-plated layer. The cover film may be disposed around the opening, and a thickness of the cover film may range from 15 μm to 45 μm. In addition, the cover film has a plurality of grooves for exposing the metal-plated layer. In this way, the solder material for soldering the FPC may be accommodated in the grooves. This facilitates solder printing of the FPC and helps improve soldering quality of the FPC.

In a possible embodiment of this application, a minimum wavelength of a signal transmitted by a component in an electronic device may be set to λ. To enable a shielding cover to meet a shielding requirement, a spacing between two adjacent grooves may be not greater than $\frac{1}{20}\lambda$.

According to a sixth aspect, an embodiment of this application further provides a printed circuit board assembly. The printed circuit board assembly includes a PCB, a component disposed on the PCB, and the shielding can disposed on the component according to the fifth aspect. The component may further pass through an opening, and there is a specified distance between the component and an FPC. Therefore, an avoidance design of the shielding can for a part of the component passing through the opening can be avoided, to help reduce a height of the shielding can along a passing direction of the component. In addition, a thickness of the current FPC is relatively small. In this way, a height of the shielding can protruding from a surface of the PCB is relatively small. This helps implement a relatively thin design of an overall thickness of the printed circuit board assembly.

According to a seventh aspect, an embodiment of this application further provides an electronic device. The electronic device includes a display screen, a middle frame, a rear housing, and the printed circuit board assembly according to the sixth aspect. The middle frame is configured to bear the printed circuit board assembly and the display screen. The display screen and the printed circuit board assembly are located on both sides of the middle frame. The rear housing is located on a side that is of the printed circuit board assembly and that is away from the middle frame. On a basis of implementing a design of the printed circuit board assembly in this embodiment of this application, a thinning design of the entire electronic device can be implemented. In addition, in some scenarios, a requirement for structural stability of the middle frame used as a bearing structure is relatively high. In this case, a thickness of the middle frame cannot be designed to be excessively small. Therefore, thinning of the printed circuit board assembly can avoid an increase in a thickness of the entire electronic device while meeting the structural stability of the middle frame.

DESCRIPTION OF EMBODIMENTS

For ease of understanding a shielding can provided in embodiments of this application, the following first describes an application scenario of the shielding can provided in embodiments of this application. The shielding can may be disposed in electronic devices such as a mobile phone, a tablet computer, a wearable device, a personal digital assistant (personal digital assistant, PDA), and the like, to protect and shield a component in the electronic device.

Figure 1:
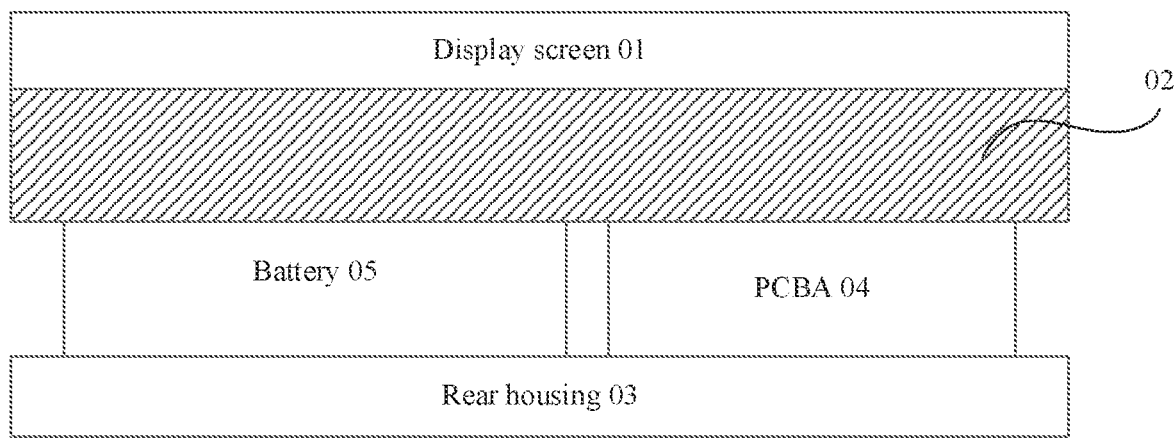
FIG. 1 is a schematic diagram of a structure of an electronic device according to an embodiment of this application.

FIG. 1 provides a schematic diagram of a structure of an electronic device. The electronic device may usually include a display screen 01, a middle frame 02, a rear housing 03, and a PCBA 04 (printed circuit board assembly, printed circuit board assembly). The middle frame 02 may be configured to bear the PCBA 04 and the display screen 01. The display screen 01 and the PCBA 04 are located on both sides of the middle frame 02, and the rear housing 03 is located on a side that is of the PCBA 04 and that is away from the middle frame 02.

When the PCBA 04 is specifically disposed, the PCBA 04 includes a PCB (printed circuit board, printed circuit board) and a component disposed on the PCB. The component may be disposed on a side that is of the PCB and that faces the display screen, or the component may be disposed on a side that is of the PCB and that faces the rear housing. The PCBA 04 further includes a shielding can disposed on the component, to avoid signal interference between the component on the PCBA 04 and another component in the electronic device, to protect and shield the component. When the PCBA 04 is disposed in the electronic device, a part of the shielding can disposed on a side that is of the PCB and that faces the middle frame may be embedded into the middle frame 02. In addition, in some embodiments, a bracket is further disposed between the PCBA 04 and the rear housing 03. In this way, the shielding can disposed on the side that is of the PCB and that faces the rear housing 03 can be fastened to the bracket, to implement fastening of the PCBA 04.

Figure 2:
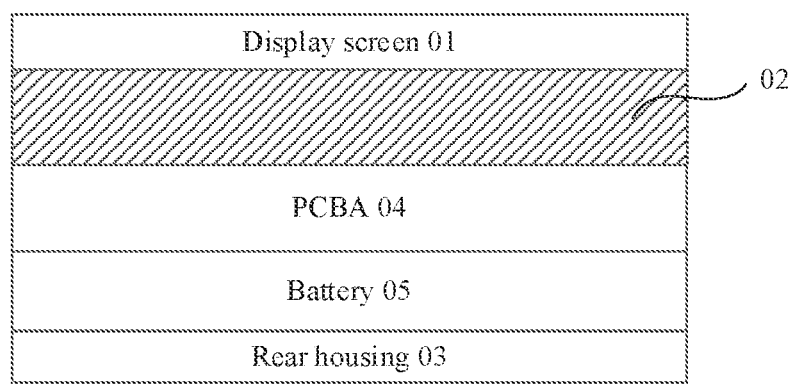
FIG. 2 is a schematic diagram of a structure of an electronic device according to another embodiment of this application.

In addition to the foregoing structure, the electronic device may further include a battery 05. In FIG. 1, the battery 05 may be disposed between the middle frame 02 and the rear housing 03. Alternatively, refer to FIG. 2. The battery 05 may be disposed between the PCBA 04 and the rear housing 03.

Currently, to comply with a development trend of a light and thin design of the electronic device, designs of all components in the electronic device need to be thinned. Because the PCBA occupies a relatively large volume in the electronic device, thinning of the PCBA helps implement thinning of the entire electronic device. In addition, in some scenarios, a requirement for structural stability of the middle frame used as a bearing structure is relatively high. In this case, a thickness of the middle frame cannot be designed to be excessively small. Therefore, thinning of the PCBA can avoid an increase in a thickness of the entire electronic device while meeting the structural stability of the middle frame.

Figure 3:
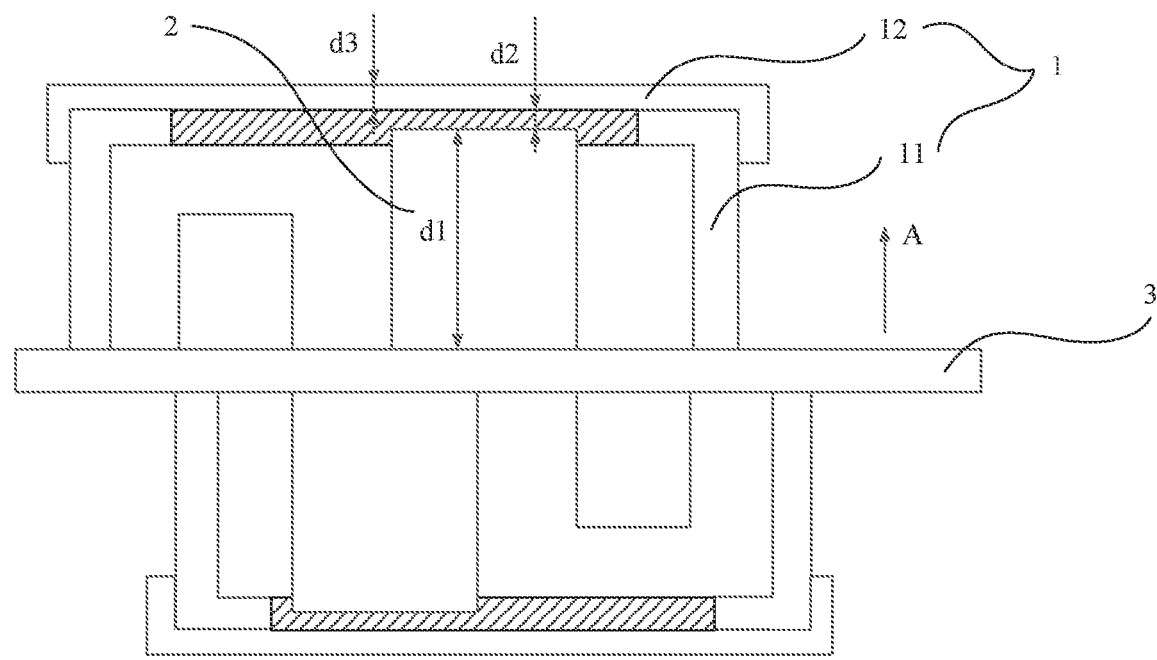
FIG. 3 is a schematic diagram of a structure of a PCBA according to an embodiment of this application.

FIG. 3 shows a disposition manner of a shielding can 1 that is usually used for a PCBA in an electronic device. The PCBA includes a PCB 3, a component 2 disposed on the PCB 3, and the shielding can 1 disposed on the component 2. The shielding can 1 includes a shielding frame 11 and a shielding cover 12 disposed on the shielding frame 11. The shielding cover 12 is an integrally formed structure. The shielding can 1 formed by the shielding cover 12 and the shielding frame 11 has a shielding cavity that accommodates the component 2. A surface A of the PCBA in FIG. 3 is used as an example. A maximum height of the component 2 protruding from the PCB 3 is set to d1, a minimum spacing between the component 2 and the shielding cover 12 is set to d2, and a thickness of the shielding cover 12 is set to d3. Therefore, a height D of the shielding can 1, which is on the surface A of the PCBA, protruding from the PCB 3 may be expressed as D=d1+d2+d3. In a case in which the maximum height d1 of the component 2 protruding from the PCB 3 is fixed, persons skilled in the art may implement a thinning design of the PCBA by reducing the minimum spacing d2 between the component 2 and the shielding cover 12 and the thickness d3 of the shielding cover 12. However, currently, the minimum spacing d2 between the component 2 and the shielding cover 12 is usually 0.05 mm. In order not to affect performance of the component 2, it is difficult to further reduce the minimum spacing between the component 2 and the shielding cover 12. In addition, to meet a requirement for structural stability of the shielding cover 12, a thickness of the shielding cover 12 with the integrally formed structure shall not be excessively thin, and is generally 0.1 mm. To resolve the foregoing problems and comply with a development trend of a thinning design of an electronic device, an embodiment of this application provides a shielding can. For ease of understanding the shielding can in this application, the following describes a structure of the shielding can with reference to accompanying drawings.

Figure 4:
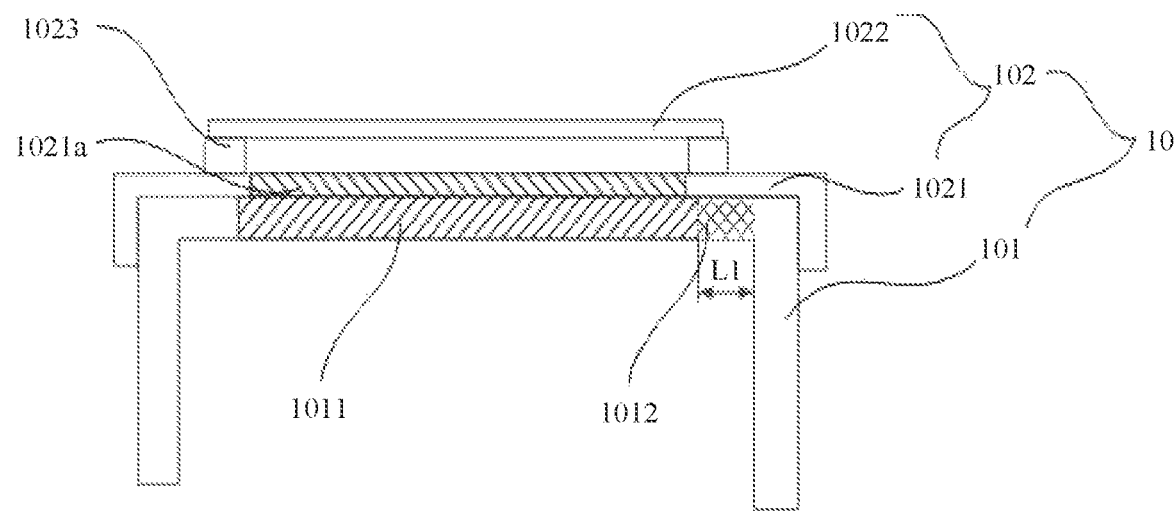
FIG. 4 is a schematic diagram of a structure of a shielding can according to an embodiment of this application.

Refer to FIG. 4. An embodiment of this application provides a shielding can 10. The shielding can 10 includes a shielding frame 101 and a shielding cover 102, and the shielding cover 102 is disposed on the shielding frame 101. It may be understood that an end that is of the shielding frame 101 and that is opposite to the shielding cover 102 allows a to-be-shielded component to enter a shielding cavity of the shielding can 10. An end that is of the shielding frame 101 and that is connected to the shielding cover 102 has an opening 1011. In addition, the shielding frame 101 may further be provided with a supporting portion 1012, and the supporting portion 1012 may support the shielding cover 102. As shown in FIG. 4, the supporting portion 1012 extends towards the inside of the shielding cavity of the shielding can 10, and an extension direction of the supporting portion 1012 may be parallel to an end face of the shielding cover 102. In this way, the supporting portion 1012 may be fit to the end face of the shielding cover 102, so that the supporting portion 1012 effectively supports the shielding cover 102. The shielding frame 101 in this embodiment of this application may be disposed in an integrated structure, and an extension length of the supporting portion 1012 may be represented by L1. However, in some possible embodiments, the shielding frame 101 may alternatively be a splicing structure.

Figure 5:
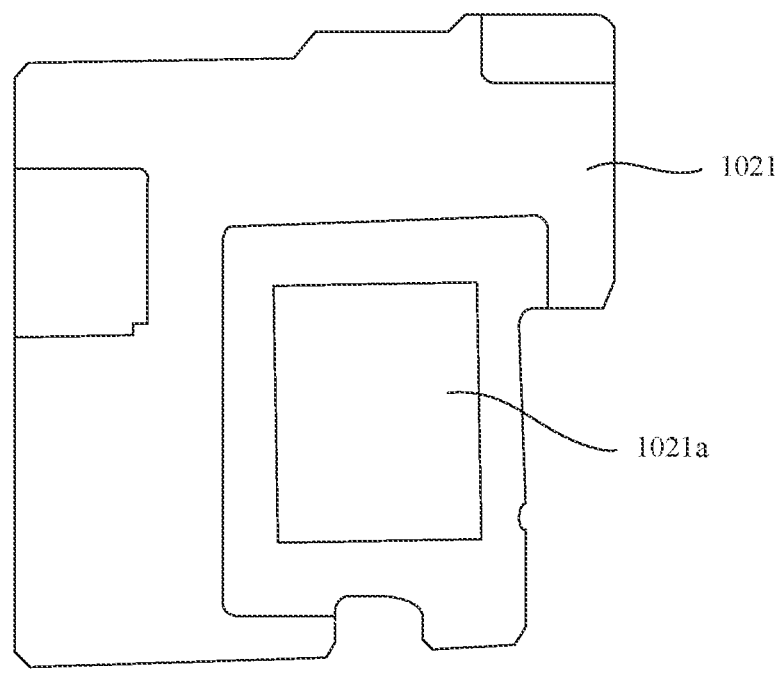
FIG. 5 is a schematic diagram of a structure of a shielding frame according to an embodiment of this application.

Still refer to FIG. 4. After the shielding cover 102 is disposed on the shielding frame 101, the shielding cover 102 and the shielding frame 101 need to be fastened. There may be a plurality of fastening manners. For example, a plurality of protrusions (not shown in the figure) may be disposed on a periphery of inner sidewalls of the shielding cover 102, and grooves (not shown in the figure) that are in a one-to-one correspondence with the plurality of protrusions are also disposed on the shielding frame. In this way, the shielding cover 102 is fastened to the shielding frame 101 in a manner of clamping the protrusions to the grooves. This connection manner can effectively improve convenience of fastening and disassembling the shielding cover 102 and the shielding frame 101. When the shielding cover 102 is specifically disposed, the shielding cover 102 includes a cover body 1021. Refer to both FIG. 4 and FIG. 5. An opening 1021a is disposed on the cover body 1021, and the opening 1021a is disposed opposite to the opening 1011. In addition, refer to FIG. 4. The shielding cover 102 further has an FPC 1022 disposed corresponding to the opening 1021a. The FPC 1022 may be soldered, by using a solder material 1023 such as solder paste, on a side that is of the cover body 1021 and that is away from the shielding frame 101.

Figure 6:
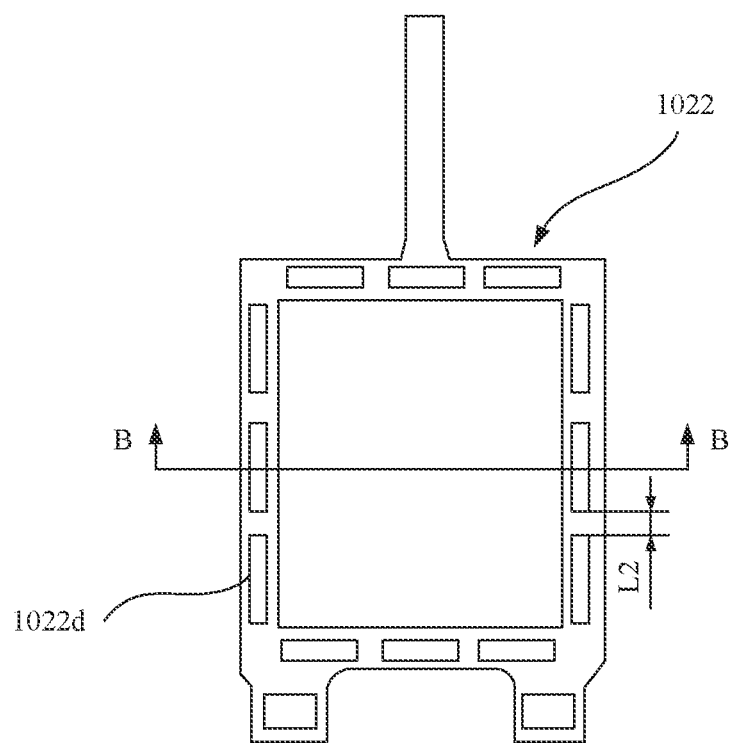
FIG. 6 is a schematic diagram of a structure of an FPC according to an embodiment of this application.
Figure 7:
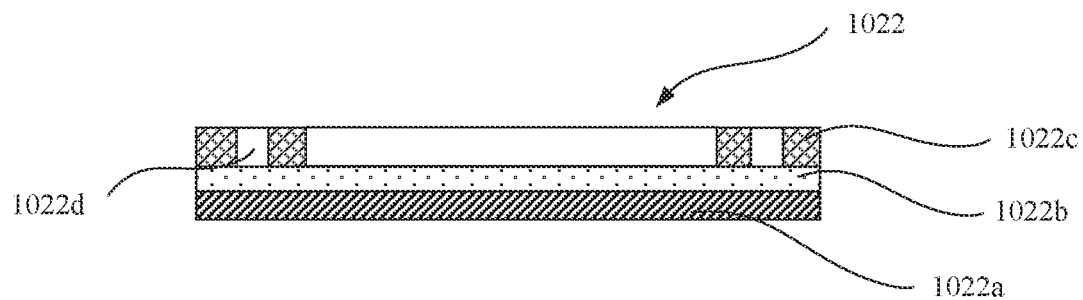
FIG. 7 is a B-B sectional view of FIG. 6.

For specific disposing of the FPC 1022, refer to both FIG. 6 and FIG. 7. FIG. 6 is a schematic diagram of a structure of the FPC 1022 according to an embodiment of this application, and FIG. 7 is a B-B sectional view of FIG. 6. It can be seen from FIG. 7 that, the FPC 1022 includes a substrate layer 1022a, and a metal-plated layer 1022b disposed on the substrate layer 1022a A material of the substrate layer 1022a may be plastic, resin, or the like, and a thickness of the substrate layer 1022a may range from 5 μm to 50 μm. The metal-plated layer 1022b, as a shield layer that mainly plays a shielding role of the FPC 1022, may be selected as a copper-plated layer. A thickness of the metal-plated layer may range from 6 μm to 36 μm. In this way, manufacturing costs of the FPC 1022 can be well controlled while the metal-plated layer has a good shielding function and a small thickness. In conclusion, a thickness of the FPC 1022 in this embodiment of this application may be less than 0.04 mm.

Refer to FIG. 6. In this embodiment of this application, a cover film 1022c may be further disposed on the metal-plated layer 1022b. The cover film 1022c may be disposed around the opening 1021a (refer to FIG. 5), and a thickness of the cover film 1022c may range from 15 μm to 45 μm. In addition, the cover film 1022c has a plurality of grooves 1022d for exposing the metal-plated layer 1022b. In this way, the solder material for soldering the FPC 1022 may be accommodated in the grooves 1022d. This facilitates solder printing of the FPC 1022 and helps improve soldering quality of the FPC 1022.

In addition, to meet a shielding performance requirement of the shielding cover, if a minimum wavelength of a signal transmitted by a component in the electronic device is set to λ, a gap L2 between two adjacent grooves 1022d on the FPC 1022 needs to be less than 1/20λ, so that when the shielding cover is used in the electronic device, the shielding cover can shield any component in the electronic device. Currently, a maximum frequency of a signal of a component in an electronic device such as a mobile phone is approximately 15 GHz. Therefore, in the electronic device such as the mobile phone, a gap L2 between two adjacent grooves 1022d may be designed to be not greater than 1 mm. Therefore, the shielding can formed by the shielding cover and the shielding frame provides an environment with good shielding performance for the component, to reduce an RSE (radiated spurious emission, radiated spurious emission) risk.

Figure 8:
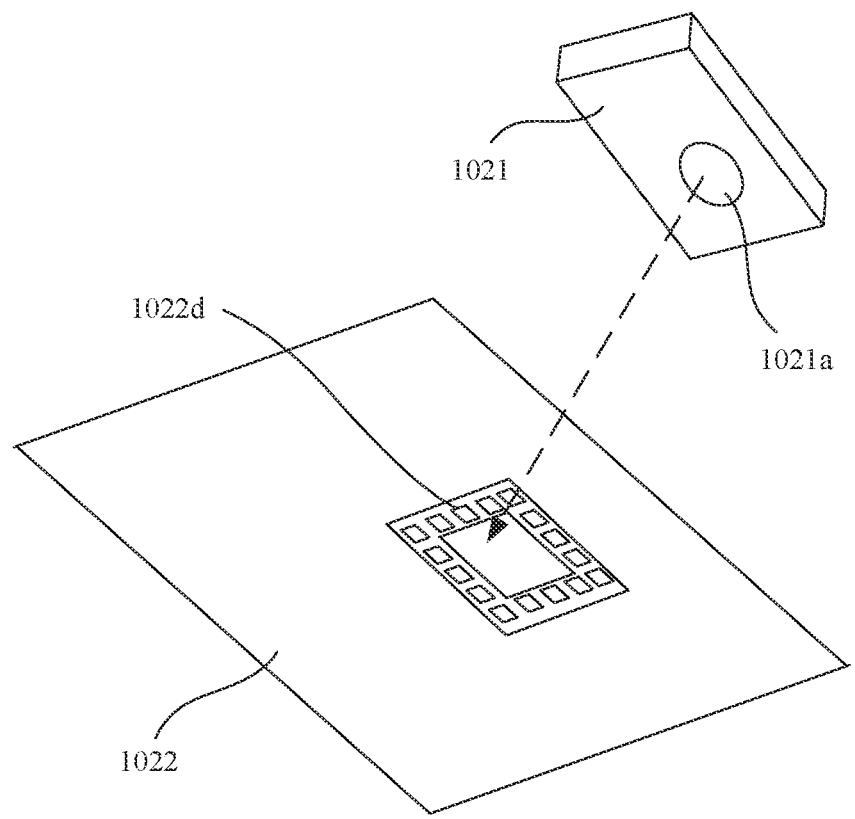
FIG. 8 is a schematic diagram of a processing process of a shielding cover according to an embodiment of this application.

Refer to FIG. 8. During manufacturing of the shielding cover in this embodiment of this application, the opening 1021a may be first disposed on an end face of the cover body 1021 of the shielding cover based on a position requirement of the opening 1021a. Then, an FPC 1022 with an area far greater than an area of the opening 1021a is flattened, and solder paste is printed in the grooves 1022d of the FPC 1022. After that, a reflow oven solders the end face of the cover body 1021 to the flattened FPC 1022 along the direction shown in FIG. 8 by using a surface mount technology (surface mount technology, SMT). Finally, a redundant part of the FPC 1022 is tailored to form the shielding cover in this embodiment of this application. In addition, because a process of soldering a component on the FPC 1022 is relatively mature, in this application, a connection between the FPC 1022 and the cover body 1021 may be relatively reliable, to improve a shielding effect of the shielding can including the shielding cover.

Figure 9:
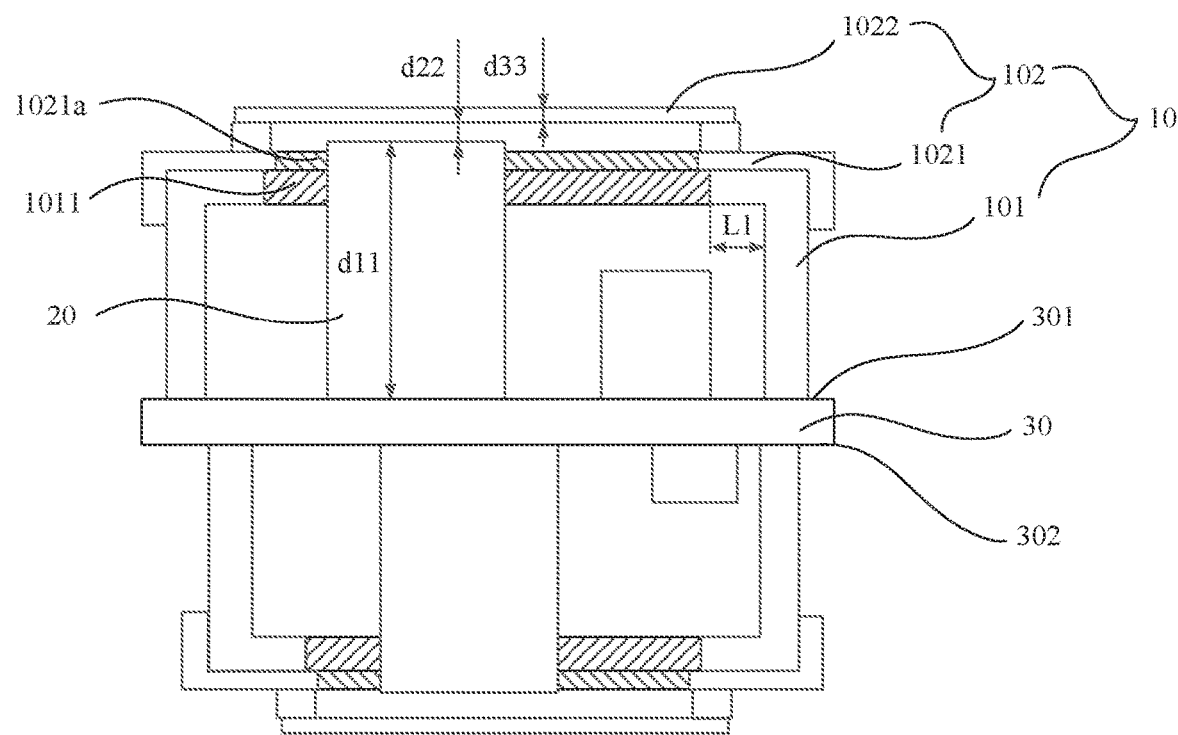
FIG. 9 is a schematic diagram of a structure of a PCBA according to an embodiment of this application.

After understanding the shielding can in embodiments of this application, the shielding can may be used on a PCBA. Refer to FIG. 9. The PCBA in this embodiment of this application includes a PCB 30 and a component 20 disposed on the PCB 30. The shielding can 10 is disposed on the component 20, to shield and protect the component 20. The PCB 30 includes a first surface 301 and a second surface 302. The component 20 may be disposed on the first surface 301, or may be disposed on the second surface 302. When there are a plurality of components 20, the plurality of components 20 may be distributedly disposed on the first surface 301 and the second surface 302 based on a specific disposing requirement of the PCBA When the shielding can 10 is specifically disposed, regardless of which surface of the PCB 30 a component 20 is disposed on, disposition manners of the shielding can 10 disposed on the component 20 may be the same. Therefore, in this embodiment of this application, a disposition of the component 20 disposed on the first surface 301 of the PCB 30 and a disposition of the shielding can 10 are first described in detail. Refer to FIG. 9. The shielding frame 101 of the shielding can 10 is disposed on a periphery of a to-be-shielded component 20, and the opening 1011 on the shielding frame 101 and the opening 1021a on the shielding cover 102 may be used for the component 20 to pass through, to avoid the component 20 or another structure disposed on the component 20. An end that is of the shielding frame 101 and that is close to the PCB 30 is fastened to the first surface 301 of the PCB 30, and a fastening manner may be soldering, bonding, or the like. In addition, the shielding can 10 is disposed in a manner of assembling the shielding frame 101 and the shielding cover 102. In this way, when the component 20 needs to be maintained, the shielding cover 10 may be directly removed without damaging a connection relationship between the shielding frame 101 and the PCB 30. This operation is relatively simple.

In FIG. 9, a maximum height of the component 20, which is disposed on the first surface 301 of the PCB 30, protruding from the PCB 30 may be set to d11. A minimum spacing between the component 20 and the FPC 1022 of the shielding cover 102 may be set to d22. A thickness of the FPC 1022 may be set to d33. Therefore, a height D' of the shielding can 10, which is on the first surface 301 of the PCB 30, protruding from the PCB 30 may be expressed as D'=d11+d22+d33. The thickness d33 of the FPC 1022 in this embodiment of this application may be less than 0.04 mm, and is far less than the thickness d3 (0.1 mm) of the shielding cover 12 in FIG. 3. The minimum spacing d22 between the component 20 (or another structure disposed on the component 20) and the FPC 1022 may also be set to 0.05 mm. In this way, when the maximum height d11 of the component 20 protruding from the PCB 30 is fixed, the height of the shielding can 10 protruding from the first surface 301 of the PCB 30 can be effectively reduced by using the solution in this embodiment of this application, to help implement a thinning design of the PCBA.

Figure 10:
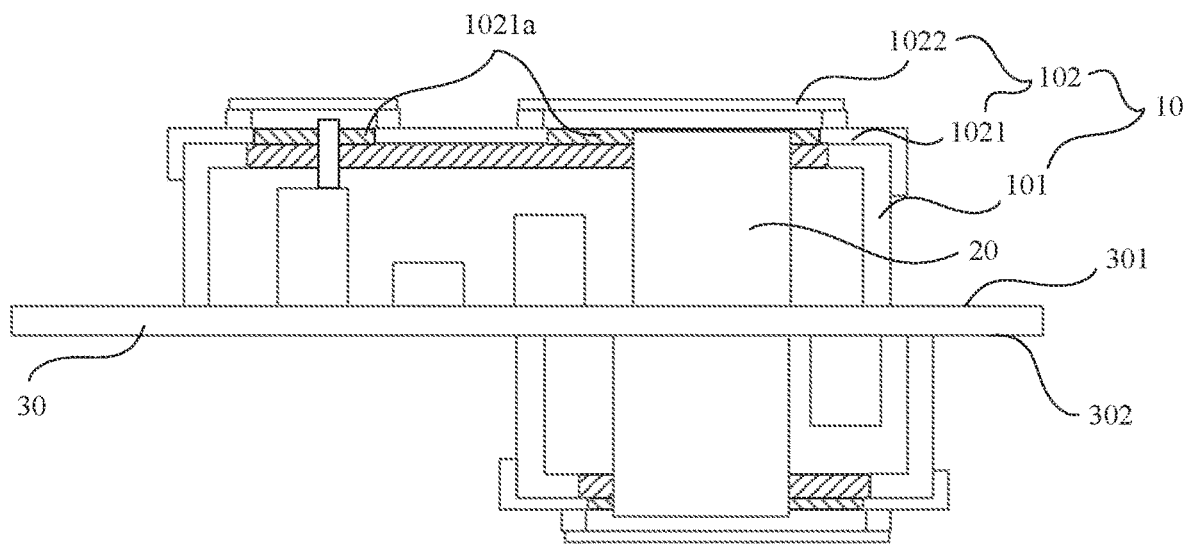
FIG. 10 is a schematic diagram of a structure of a PCBA according to another embodiment of this application.

In addition, refer to FIG. 10. In some embodiments, the shielding can 10 needs to avoid a plurality of components 20 (or structures disposed on the components 20). In this case, openings 1021a need to be separately disposed at corresponding locations on the cover body 1021 of the shielding cover 102, and each FPC 1022 needs to be disposed at each location corresponding to each opening 1021a, to block each opening 1021a.

Still refer to FIG. 10. The shielding can 10 on the second surface 302 of the PCB 30 may be disposed with reference to the first surface 301, and details are not described herein again.

Figure 11:
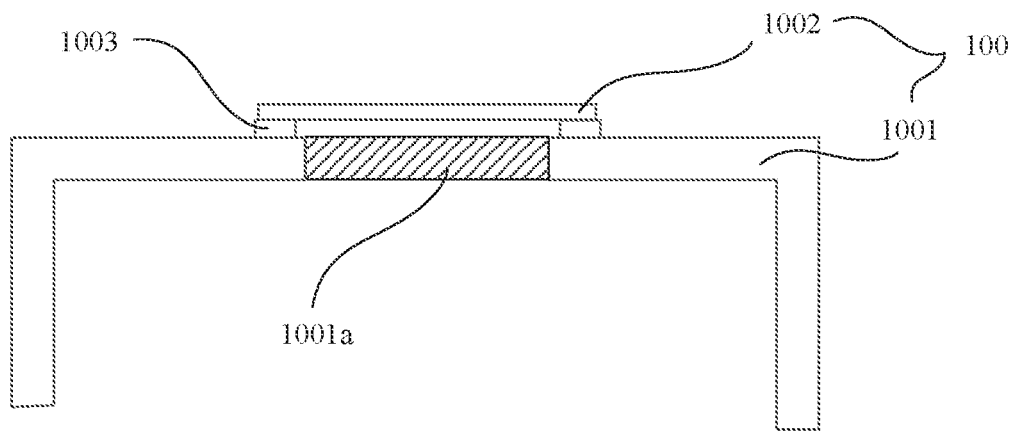
FIG. 11 is a schematic diagram of a structure of a shielding can according to another embodiment of this application.

Refer to FIG. 11. In some embodiments of this application, a shielding can 100 is further provided. The shielding can 100 includes a can body 1001 of an integrated structure. The can body 1001 has a shielding cavity that can accommodate a component. An opening 1001a is disposed on an end face of an end of the can body 1001. It can be understood that a to-be-shielded component may enter the shielding cavity through an end that is of the can body 1001 and that is opposite to the opening 1001a. In addition, to implement sealing and shielding of the shielding can 100, an FPC 1002 corresponding to the opening 1001a further needs to be disposed on the can body 1001. The FPC 1002 may be soldered, by using a solder material 1003 such as solder paste, on a side that is of the opening 1001a and that is away from the shielding cavity, to block the opening 1001a. The shielding can 100 in this embodiment of this application includes only the can body 1001 and the FPC 1002 disposed at the opening 1001a. Therefore, a structure of the shielding can 100 is simple.

For specific disposing of the FPC 1002, refer to the embodiments shown in FIG. 6 and FIG. 7. The FPC 1002 includes a substrate layer, and a metal-plated layer disposed on the substrate layer. A material of the substrate layer may be plastic, resin, or the like, and a thickness of the substrate layer may range from 5 μm to 50 μm. The metal-plated layer, as a shield layer that mainly plays a shielding role of the FPC 1002, may be selected as a copper-plated layer. A thickness of the metal-plated layer may range from 6 μm to 36 μm. In this way, manufacturing costs of the FPC 1002 can be well controlled while the metal-plated layer has a good shielding function and a small thickness. In conclusion, a thickness of the FPC 1002 in this embodiment of this application may be less than 0.04 mm.

In addition, a cover film may be further disposed on the metal-plated layer. The cover film may be disposed around the opening, and a thickness of the cover film may range from 15 μm to 45 μm. In addition, the cover film has a plurality of grooves for exposing the metal-plated layer. In this way, the solder material for soldering the FPC 1002 may be accommodated in the grooves. This facilitates solder printing of the FPC 1002 and helps improve soldering quality of the FPC 1002.

To meet a shielding performance requirement of the shielding cover, if a minimum wavelength of a signal in the electronic device is set to λ, a gap between two adjacent grooves on the FPC 1002 needs to be less than ½₀λ. Currently, a maximum frequency of a signal in an electronic device such as a mobile phone is approximately 15 GHz. Therefore, in this application, a gap between two adjacent grooves may be designed to be not greater than 1 mm. Therefore, the shielding can formed by the shielding cover and the shielding frame provides an environment with good shielding performance for a component, to reduce an RSE (radiated spurious emission, radiated spurious emission) risk.

Figure 12:
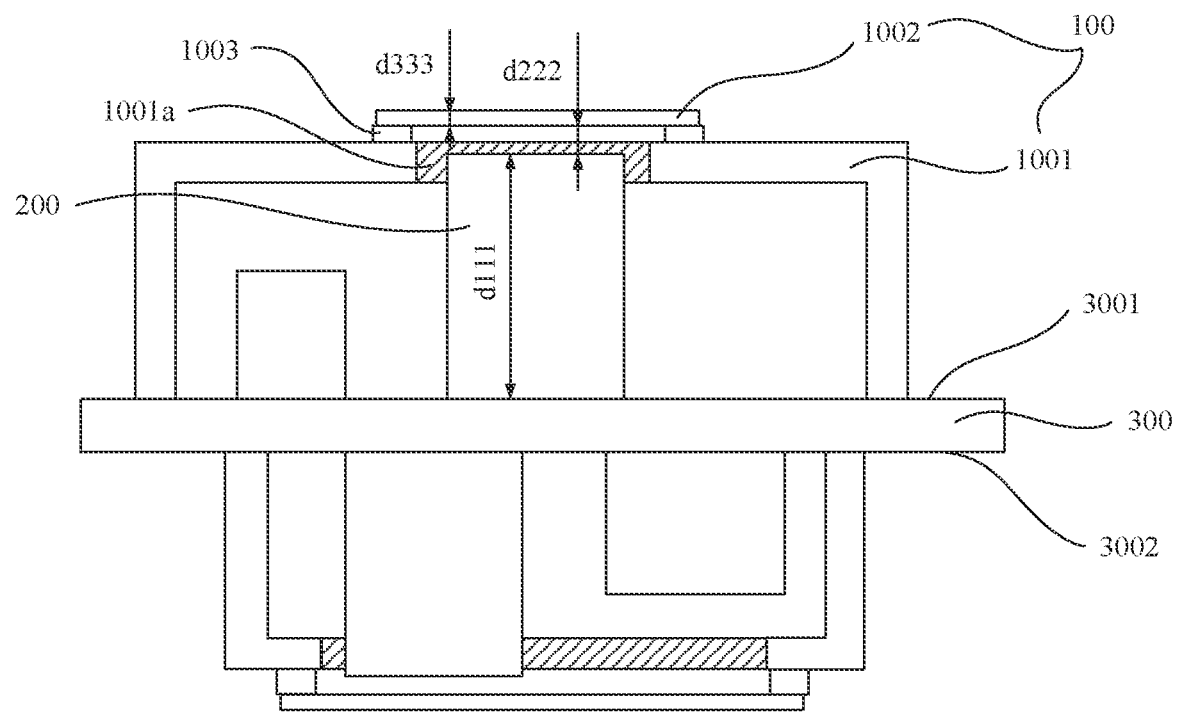
FIG. 12 is a schematic diagram of a structure of a PCBA according to another embodiment of this application.

The shielding can 100 in this embodiment of this application may be for protecting a component 200 of a PCBA. Refer to FIG. 12. The PCBA in this embodiment of this application includes a PCB 300, the component 200 disposed on the PCB 300, and the shielding can 100 disposed on the component 200. The PCB 300 includes a first surface 3001 and a second surface 3002. The component 200 may be disposed on the first surface 3001, or may be disposed on the second surface 3002. When there are a plurality of components 200, the plurality of components 200 may be distributedly disposed on the first surface 3001 and the second surface 3002 based on a specific disposing requirement of the PCBA When the shielding can 100 is specifically disposed, regardless of which surface of the PCB 300 a component 200 is disposed on, disposition manners of the shielding can 100 disposed on the component 200 may be the same. Therefore, in this embodiment of this application, a disposition of the component 200 disposed on the first surface 3001 of the PCB 300 and a disposition of the shielding can 100 are first described in detail. Refer to FIG. 12. The can body 1001 of the shielding can 100 is disposed on a to-be-shielded component 200, and an end that is of the can body 1001 and that is close to the PCB 300 may be fastened to the first surface 3001 of the PCB 300 in a manner such as soldering. The opening 1001a of the can body 1001 of the shielding can 100 may avoid the component 200 or another structure disposed on the component 200.

In FIG. 12, a maximum height of the component 200, which is disposed on the first surface 3001 of the PCB 300, protruding from the PCB 300 may be set to d111. A minimum spacing between the component 200 and the FPC 1002 may be set to d222. A thickness of the FPC 1002 may be set to d333. Therefore, a height D" of the shielding can 100, which is on the first surface 3001 of the PCB 300, protruding from the PCB 300 may be expressed as D"=d111+d222+d333. The thickness d333 of the FPC 1002 in this embodiment of this application may be less than 0.04 mm, and is far less than the thickness d3 (0.1 mm) of the shielding cover 12 in FIG. 3. The minimum spacing d222 between the component 200 (or another structure disposed on the component 200) and the FPC 1002 may also be set to 0.05 mm. In this way, when the maximum height d111 of the component 200 protruding from the PCB 300 is fixed, the height of the shielding can 100 protruding from the PCB 300 can be effectively reduced by using the solution in this embodiment of this application, to help implement a thinning design of the PCBA. In addition, when being used, the shielding can 100 may be directly disposed on the to-be-shielded component 200, and then be fastened to the PCB 300. This operation is relatively simple.

Still refer to FIG. 12. In this embodiment of this application, the shielding can on the second surface 3002 of the PCB 300 may be disposed with reference to the first surface 3001, and details are not described herein again.

Figure 13:
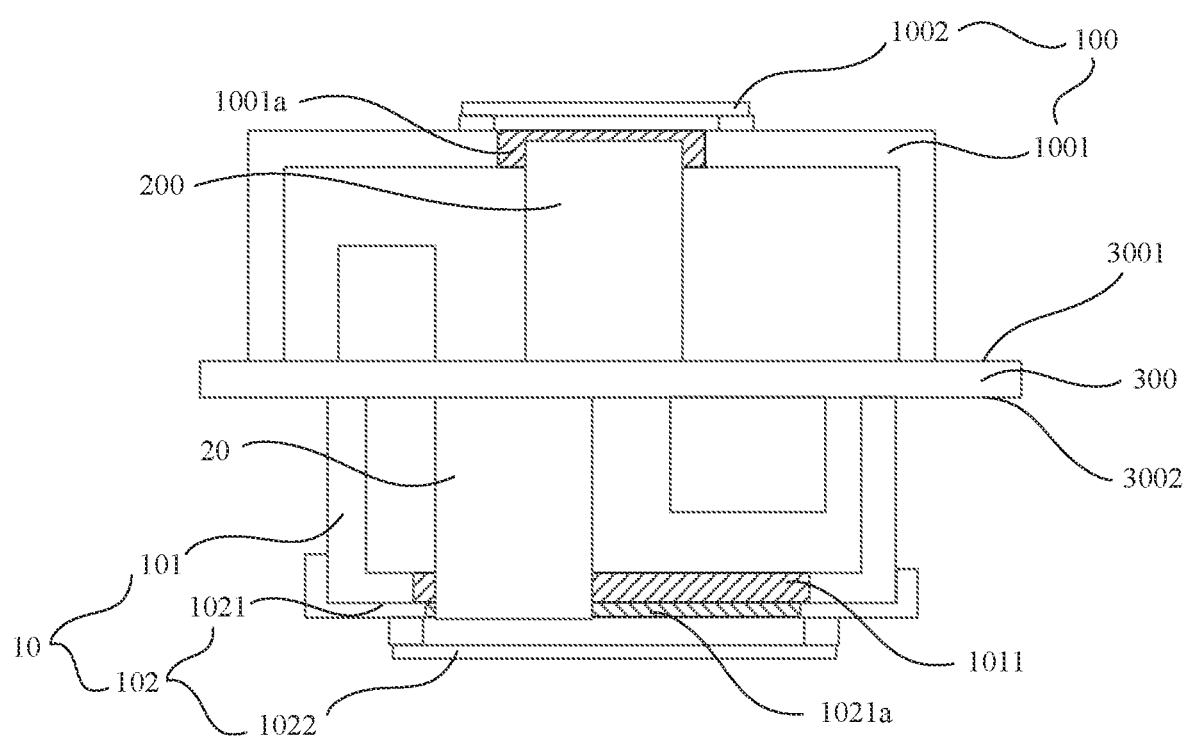
FIG. 13 is a schematic diagram of a structure of a PCBA according to another embodiment of this application.

Refer to FIG. 13. An embodiment of this application further provides a PCBA. The PCBA includes a PCB 300, a component 200 disposed on the PCB 300, and a shielding can 100 disposed on the component 200. The PCB 300 includes a first surface 3001, a second surface 3002, the component 200 disposed on the first surface 3001, a component 20 disposed on the second surface 3002, the shielding can 100 disposed on the component 200, and a shielding can 10 disposed on the component 20.

When the shielding can 100 is specifically disposed, the shielding can 100 includes a can body 1001 of an integrated structure. The can body 1001 is disposed on a to-be-shielded component 200, and an end that is of the can body 1001 and that is close to the PCB 300 may be fastened to the first surface 3001 of the PCB 300 in a manner such as soldering. An opening 1001a for the component 200 to pass through is disposed on an end face of an end that is of the can body 1001 and that is away from the PCB 300, and the opening 1001a may avoid the component 200 or another structure disposed on the component 200.

In addition, to implement sealing and shielding of the shielding can 100, an FPC 1002 corresponding to the opening 1001a further needs to be disposed on the can body 1001. The FPC 1002 may be soldered, by using a solder material such as solder paste, on a side that is of the can body 1001 of the shielding can 100 and that is away from the PCB 300. Because the shielding can 100 includes only the can body 1001 and the FPC 1002 disposed at the opening 1001a on the end face, a structure of the shielding can 100 is relatively simple. When being used, the shielding can 100 may be directly disposed on the to-be-shielded component 200, and then be fastened to the PCB 300. This operation is relatively simple.

When the shielding can 10 is specifically disposed, the shielding can 10 includes a shielding frame 101 and a shielding cover 102. The shielding frame 101 is disposed on a periphery of a to-be-shielded component 20, and an end that is of the shielding frame 101 and that is close to the PCB 300 may be fastened to the second surface 3002 of the PCB 300 in a manner such as soldering. An end that is of the shielding frame 101 and that is away from the PCB 300 has an opening 1011 for the component 20 to pass through. The opening 1011 may avoid the component 20 or another structure disposed on the component 20.

Still refer to FIG. 13. The shielding cover 102 of the shielding can 10 may be disposed on the shielding frame 101, and be fixedly connected to an end that is of the shielding frame 101 and that is away from the PCB 300. A connection manner may be but is not limited to soldering. When the shielding cover 102 is specifically disposed, the shielding cover 102 includes a cover body 1021. An opening 1021a is disposed on the cover body 1021, and the opening 1021a is disposed opposite to the opening 1011. In addition, the shielding cover 102 further has an FPC 1022 disposed corresponding to the opening 1021a. The FPC 1022 may be soldered, by using a solder material such as solder paste, to a side that is of the cover body 1021 and that is away from the PCB 300, to block the opening 1021a. The shielding can 10 is disposed as a separate form of assembling the shielding frame 101 and the shielding cover 102. In this way, when the component 20 needs to be maintained, the shielding cover 102 may be directly removed without damaging a connection relationship between the shielding frame 101 and the PCB 300. This operation is relatively simple.

The foregoing descriptions are merely specific implementations of this application, but are not intended to limit the protection scope of this application. Any variation or replacement readily figured out by persons skilled in the art within the technical scope disclosed in this application shall fall within the protection scope of this application. Therefore, the protection scope of this application shall be subject to the protection scope of the claims.

What is claimed is:

1. A shielding cover in an electronic device comprising:
a cover body comprising an end face, wherein the end face comprises an outer side;
a first opening disposed on the end face; and
a flexible printed circuit board disposed on the cover body, affixed to the outer side, and configured to block the first opening, wherein the flexible printed circuit board comprises:
a substrate layer;
a metal-plated layer disposed adjacent to the substrate layer; and
a cover film disposed on the metal-plated layer along a periphery of the first opening, wherein the cover film comprises a plurality of grooves through which the metal-plated layer is exposed, and wherein the shielding cover further comprises a solder material accommodated in the grooves.

2. The shielding cover of claim 1, wherein a first thickness of the substrate layer ranges from 5 micrometers (μm) to 50 μm.

3. The shielding cover of claim 2, wherein a second thickness of the metal-plated layer ranges from 6 μm to 36 μm.

4. The shielding cover of claim 1, wherein a spacing between two adjacent grooves is not greater than 1/20, and wherein 2, is a minimum wavelength of a signal transmitted by a component in the electronic device.

5. The shielding cover of claim 1, wherein a third thickness of the cover film ranges from 15 μm to 45 pm.

6. An electronic device comprising:
a display screen;
a printed circuit board assembly comprising:
a printed circuit board;
a component disposed on the printed circuit board; and
a shielding can disposed on the component, wherein the shielding can comprises:
a shielding frame affixed to the printed circuit board and comprising a first end that is away from the printed circuit board, wherein the first end comprises a second opening; and
a shielding cover disposed on the shielding frame and comprising:
a cover body comprising an end face, wherein the end face comprises a third side that is away from the shielding frame;
a first opening disposed on the end face; and
a flexible printed circuit board disposed on the cover body, affixed to the third side, and configured to block the first opening, wherein the flexible printed circuit board comprises a substrate layer;
a middle frame comprising a first side and a second side and configured to bear the printed circuit board assembly and the display screen,
wherein the display screen is located on the first side, wherein the printed circuit board assembly is located on the second side; and
a rear housing located on the second side and away from the middle frame,
wherein the second opening is disposed opposite to the first opening,
wherein the component sequentially passes through the second opening and the first opening, and
wherein the component and the flexible printed circuit board are separated by a first distance.

7. The electronic device of claim 6, wherein a first thickness of the substrate layer ranges from 5 micrometers (μm) to 50 μm.

8. The electronic device of claim 7, wherein the flexible printed circuit board further comprises a metal-plated layer disposed on the substrate layer, and wherein a second thickness of the metal-plated layer ranges from 6 μm to 36 μm.

9. The electronic device of claim 8, wherein the flexible printed circuit board further comprises a cover film disposed on the metal-plated layer along a periphery of the first opening, wherein the cover film comprises a plurality of first grooves through which the metal-plated layer is exposed, and wherein the shielding cover further comprises a solder material accommodated in the first grooves.

10. The electronic device of claim 9, wherein a spacing between two adjacent first grooves is not greater than 1/20λ, and wherein λ is a minimum wavelength of a signal transmitted by the component.

11. The electronic device of claim 9, wherein a third thickness of the cover film ranges from 15 μm to 45 μm.

12. The electronic device of claim 11, wherein the shielding cover comprises:
inner sidewalls, wherein a plurality of protrusions is disposed on the inner sidewalls; and
a plurality of second grooves, wherein the protrusions and the second grooves are clamped together in a one-to-one correspondence.

13. The electronic device of claim 6, further comprising a supporting portion disposed at the first end and extending to an inside of the shielding frame, and wherein the end face is fits to the supporting portion.

14. The electronic device of claim 6, wherein the shielding can is disposed on the second side and faces the middle frame, wherein the middle frame further comprises an accommodation slot disposed on the middle frame, and wherein the shielding can is partially or entirely accommodated in the accommodation slot.

15. The electronic device of claim 6, further comprising a bracket disposed between the printed circuit board assembly and the rear housing, wherein the shielding can is disposed on the second side and faces the rear housing, and wherein the shielding can is affixed to the bracket.

16. A printed circuit board assembly comprising:
a printed circuit board;
a component disposed on the printed circuit board; and
a shielding can disposed on the component and comprising:
a can body affixed to the printed circuit board and comprising:
an end located away from the printed circuit board;
an opening located at the end; and
a side located away from the printed circuit board; and
a flexible printed circuit board disposed on the can body, affixed to the side, and configured to block the opening, wherein the flexible printed circuit board comprises a substrate layer, wherein the component passes through the opening, and wherein the component and the flexible printed circuit board are separated by a predetermined distance.

17. The printed circuit board assembly of claim 16, wherein a first thickness of the substrate layer ranges from 5 micrometers (μm) to 50 μm.

18. The printed circuit board assembly of claim 17, wherein the flexible printed circuit board further comprises a metal-plated layer disposed on the substrate layer, and wherein a second thickness of the metal-plated layer ranges from 6 μm to 36 μm.

19. The printed circuit board assembly of claim 18, wherein the flexible printed circuit board further comprises a cover film disposed on the metal-plated layer along a periphery of the opening and comprises a plurality of grooves through which the metal-plated layer is exposed, and wherein the shielding can further comprises a solder material accommodated in the grooves.

20. The printed circuit board assembly of claim 19, wherein a third thickness of the cover film ranges from 15 μm to 45 μm.

* * * * *

UNITED STATES PATENT AND TRADEMARK OFFICE
CERTIFICATE OF CORRECTION

PATENT NO. : 12,213,293 B2
APPLICATION NO. : 17/780896
DATED : January 28, 2025
INVENTOR(S) : Huanhuan Yu and Dongqing Ding Page 1 of 1

It is certified that error appears in the above-identified patent and that said Letters Patent is hereby corrected as shown below:

In the Claims

Claim 4, Column 13, Line 37: "than 1/20, and" should read "than 1/20$\lambda$, and"

Claim 4, Column 13, Line 38: "wherein 2, is" should read "wherein $\lambda$, is"

Signed and Sealed this
Twenty-fifth Day of March, 2025

Coke Morgan Stewart
*Acting Director of the United States Patent and Trademark Office*